(12) United States Patent
Zhang et al.

(10) Patent No.: US 8,939,029 B2
(45) Date of Patent: Jan. 27, 2015

(54) MEMS SENSOR WITH MOVABLE Z-AXIS SENSING ELEMENT

(75) Inventors: Xin Zhang, Acton, MA (US); Michael W. Judy, Ipswich, MA (US)

(73) Assignee: Analog Devices, Inc., Norwood, MA (US)

( * ) Notice: Subject to any disclaimer, the term of this patent is extended or adjusted under 35 U.S.C. 154(b) by 394 days.

(21) Appl. No.: 13/437,859

(22) Filed: Apr. 2, 2012

(65) Prior Publication Data

US 2012/0223726 A1 Sep. 6, 2012

Related U.S. Application Data

(63) Continuation-in-part of application No. 12/205,241, filed on Sep. 5, 2008, now Pat. No. 8,146,425.

(51) Int. Cl.
| | |
|---|---|
| *G01P 15/125* | (2006.01) |
| *G01P 15/08* | (2006.01) |
| *B81B 3/00* | (2006.01) |
| *G01P 15/18* | (2013.01) |
| *G01P 21/00* | (2006.01) |

(52) U.S. Cl.
CPC ........... *G01P 15/0802* (2013.01); *B81B 3/0051* (2013.01); *G01P 15/125* (2013.01); *G01P 15/18* (2013.01); *G01P 21/00* (2013.01); *B81B 2203/053* (2013.01); *G01P 2015/0871* (2013.01)
USPC .................................................... 73/514.32

(58) Field of Classification Search
USPC ....................................... 73/517.32; 361/280
See application file for complete search history.

(56) References Cited

U.S. PATENT DOCUMENTS

| | | | |
|---|---|---|---|
| 5,352,918 A | 10/1994 | Thomas et al. | |
| 5,375,469 A * | 12/1994 | Levy et al. ................. | 73/514.23 |
| 5,415,040 A | 5/1995 | Nottmeyer ................... | 73/517 R |
| 6,158,280 A | 12/2000 | Nonomura et al. | |
| 6,308,569 B1 | 10/2001 | Stewart | |
| 6,564,643 B1 | 5/2003 | Horie et al. ..................... | 73/724 |
| 6,892,576 B2 | 5/2005 | Samuels et al. | |
| 8,146,425 B2 | 4/2012 | Zhang et al. | |

(Continued)

FOREIGN PATENT DOCUMENTS

| | | | |
|---|---|---|---|
| DE | 102009028371 A1 | 2/2011 | ............... B81B 7/02 |
| EP | 1695937 | 8/2006 | ............... B81B 7/02 |
| JP | 11-218545 | 8/1999 | ............ G01P 15/125 |

(Continued)

OTHER PUBLICATIONS

International Searching Authority, International Search Report—International Application No. PCT/US2009/052964, dated Nov. 2, 2010, together with the Written Opinion of the International Searching Authority, 9 pages.

(Continued)

*Primary Examiner* — John Chapman, Jr.
(74) *Attorney, Agent, or Firm* — Sunstein Kann Murphy & Timbers LLP (57) ABSTRACT

A MEMS sensor includes a substrate and a MEMS structure coupled to the substrate. The MEMS structure has a mass movable with respect to the substrate. The MEMS sensor also includes a reference structure electrically coupled to the mass of the MEMS sensor. The reference structure is used to provide a reference to offset any environmental changes that may affect the MEMS sensor in order to increase the accuracy of its measurement.

18 Claims, 4 Drawing Sheets

(56) References Cited

U.S. PATENT DOCUMENTS

| | | | |
|---|---|---|---|
| 2007/0062285 A1 | 3/2007 | Yamaguchi et al. | 73/514.32 |
| 2010/0058865 A1 | 3/2010 | Zhang et al. | 73/514.38 |

FOREIGN PATENT DOCUMENTS

| | | | |
|---|---|---|---|
| JP | 2000-121472 | 4/2000 | G01L 9/12 |
| JP | 2002-267559 | 9/2002 | G01L 9/12 |
| JP | 2003-042879 | 2/2003 | G01L 13/06 |
| JP | 2004-294158 | 10/2004 | G01L 9/00 |
| JP | 2006-263902 | 10/2006 | B81C 1/00 |
| JP | 2007-085747 | 4/2007 | G01P 15/125 |
| JP | 2008-070230 | 3/2008 | G01P 15/08 |
| WO | 2008086530 | 7/2008 | |

OTHER PUBLICATIONS

Office Action in Japanese for Japanese Patent No. 2011-526081, 6 pages, dated May 26, 2014.

Office Action (English translation) for Japanese Patent No. 2011-526081, 6 pages, dated May 26, 2014.

International Searching Authority, Authorized Officer, Mark Robinson, International Search Report and Written Opinion, International Application No. PCT/US2013/033974, dated Jun. 26, 2013, 9 pages.

* cited by examiner

MEMS SENSOR WITH MOVABLE Z-AXIS SENSING ELEMENT

CROSS-REFERENCE TO RELATED APPLICATIONS

The present application is a continuation-in-part of U.S. patent application Ser. No. 12/205,241 filed Sep. 5, 2008, the disclosure of which is incorporated by reference herein in its entirety.

TECHNICAL FIELD

The invention generally relates to sensing elements for MEMS sensors and, more particularly, the invention relates to a movable sensing element for measuring z-axis movement in MEMS sensors.

BACKGROUND ART

Sensors employing microelectromechanical systems (MEMS) devices are increasingly used in different applications to detect the movement of an underlying object or the presence of a substance or condition due to their relatively small size and their capability to detect relatively small amounts or changes in the measured item. MEMS devices typically employ a movable, inertial mass or flexible membrane formed with one or more fixed, non-moving structures or fingers. For example, in a MEMS accelerometer, the inertial mass may be suspended in a plane above a substrate and movable with respect to the substrate. The movable structure and the fixed structures form a capacitor having a capacitance that changes when the movable structure moves relative to the fixed structures in response to applied forces or acceleration, such as along a predetermined axis of the device, e.g., x- and y-axes.

For example, commercial MEMS accelerometers that measure out-of-plane or z-axis movement may have electrodes positioned above and/or below the inertial mass to allow measurement of differential capacitance in the z-axis. Designs based on an electrode under the inertial mass typically entail driving, or putting a potential on, the inertial mass and using the electrode under the inertial mass to sense z-axis motion capacitively. However, parasitic capacitance between the electrode and the substrate may undesirably impact the reliability of this measurement.

SUMMARY OF EMBODIMENTS

In accordance with one embodiment of the invention, a MEMS sensor includes a substrate and a MEMS structure coupled to the substrate. The MEMS structure has a mass movable with respect to the substrate. The MEMS sensor also includes a reference structure electrically coupled to the movable mass of the MEMS structure.

In accordance with related embodiments, the reference structure may substantially circumscribe the MEMS structure or the MEMS structure may substantially circumscribe the reference structure. One surface of the reference structure may be substantially coplanar with one surface of the MEMS structure. The MEMS structure may be radially outward from the reference structure. The MEMS sensor may further include a z-plane MEMS electrode formed on the substrate. The z-plane MEMS electrode may be formed substantially beneath the MEMS structure. The MEMS sensor may further include a z-plane reference electrode formed on the substrate and coplanar with the z-plane MEMS electrode. The z-plane reference electrode may be formed substantially beneath the reference structure. The MEMS sensor may further include a cap formed above the MEMS structure and the reference structure. The cap may encapsulate the MEMS structure and the reference structure. The substrate may further include electronic circuitry formed on or in the substrate.

In accordance with another embodiment of the invention, a method of producing a MEMS sensor provides a substrate and forms a MEMS structure coupled to the substrate. The MEMS structure has a mass movable with respect to the substrate. The method also forms a reference structure electrically coupled to the movable mass of the MEMS structure.

In accordance with related embodiments, the method may further form a z-plane MEMS electrode on the substrate and form a z-plane reference electrode on the substrate substantially coplanar with the z-plane MEMS electrode. The z-plane MEMS electrode and the z-plane reference electrode may be formed during the same processing step. Similarly, the reference structure and the MEMS structure may be formed during the same processing step.

In accordance with another embodiment of the invention, a method of measuring motion in a z-axis using a MEMS sensor provides a substrate having a z-plane MEMS electrode on the substrate and provides a MEMS structure substantially above the z-plane MEMS electrode. The MEMS structure is coupled to the substrate and has a mass movable with respect to the substrate. The method further provides a reference structure electrically coupled to the movable mass to form a sensing element. The method also applies a potential to the z-plane MEMS electrode and measures a change in capacitance between the sensing element and the z-plane MEMS electrode using the sensing element.

In accordance with related embodiments, the method may further provide a z-plane reference electrode on the substrate substantially coplanar with the z-plane MEMS electrode. The z-plane reference electrode may be formed substantially beneath the reference structure. The method may also apply a potential to the z-plane reference electrode and measure the change in capacitance between the sensing element and the z-plane reference electrode using the sensing element.

BRIEF DESCRIPTION OF THE DRAWINGS

The foregoing and advantages of the invention will be appreciated more fully from the following further description thereof with reference to the accompanying drawings wherein.

DESCRIPTION OF ILLUSTRATIVE EMBODIMENTS

Various embodiments of the present invention provide a movable sensing element for measuring z-axis movement in a MEMS sensor. The movable sensing element is formed from a MEMS structure having a movable mass and an external reference structure electrically coupled to the movable mass of the MEMS structure. In some embodiments, the reference structure may be located radially outward and substantially surround the MEMS structure and in some embodiments the MEMS structure, or a portion of the MEMS structure, may be located radially outward from the reference structure with the MEMS structure, or a portion thereof, substantially surrounding the reference structure. In addition, the reference structure may be coplanar with the MEMS structure. The reference structure is physically separate from, but electrically coupled to, the movable mass of the MEMS structure. This configuration, in conjunction with a z-plane MEMS electrode underneath the MEMS structure, allows the movable sensing element to sense changes in capacitance between the z-plane MEMS electrode and the sensing element as the movable mass moves in the z-axis. Details of illustrative embodiments are discussed below.

As known by those skilled in the art, MEMS structures are commonly made by a sequence of thin film depositions and etches performed on a substrate. Although the following discussion describes various relevant steps of forming a z-axis MEMS sensor, it does not describe all the required steps. Other processing steps may also be performed before, during, and/or after the discussed steps. Such steps, if performed, have been omitted for simplicity. The order of the processing steps may also be varied and/or combined. Accordingly, some steps are not described and shown. Similarly, although the following discussion involves inertial sensors, principles of illustrative embodiments may apply to other sensor devices, such as MEMS pressure sensors, MEMS microphones, and MEMS fluid sensors. As known to those skilled in the art, fluid sensors may sense gases, liquids and/or multiphase compositions. Accordingly, discussion of inertial sensors is exemplary and is not intended to limit the scope of various embodiments of the invention.

Figure 1:
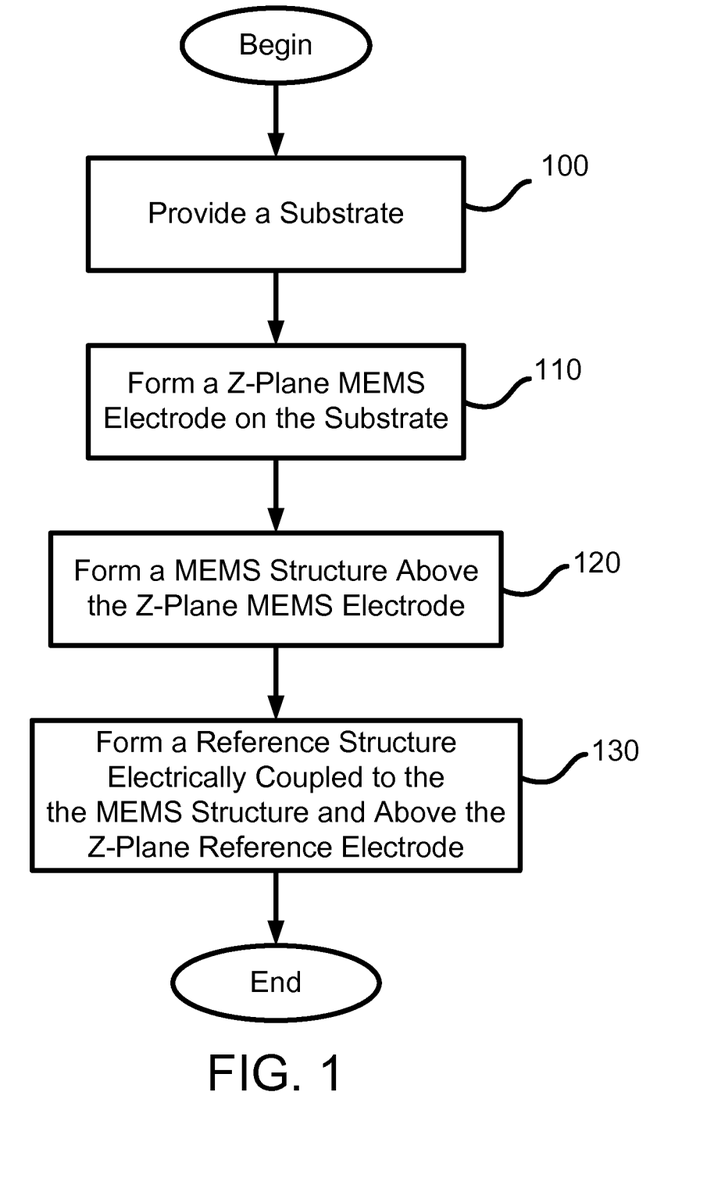
FIG. 1 shows a process of producing a MEMS sensor with a movable z-axis sensing element according to embodiments of the present invention.
Figure 2:
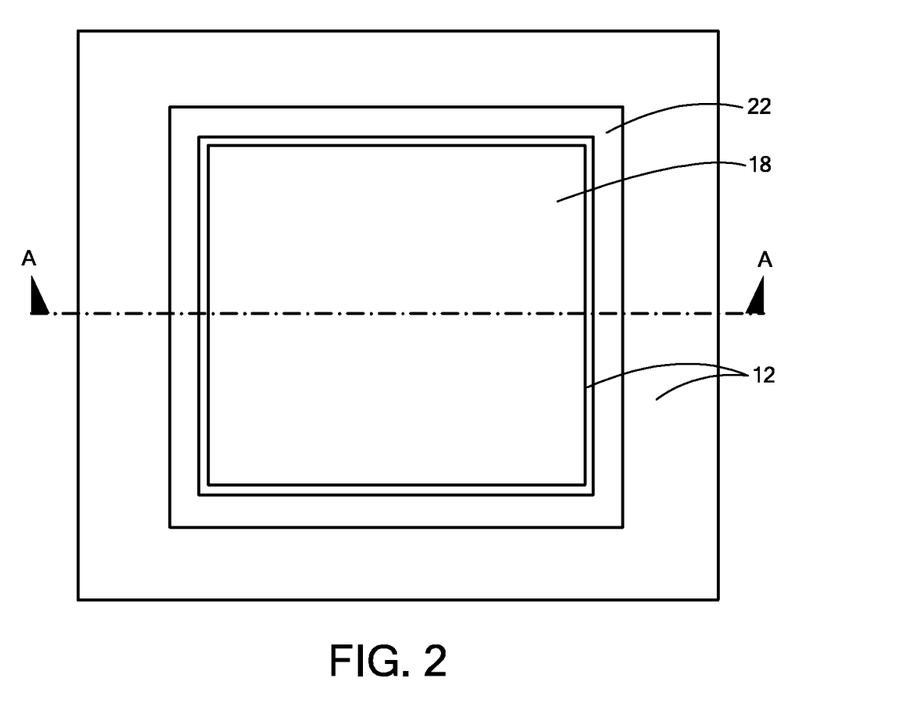
FIG. 2 schematically shows a plan view of a MEMS device with a movable z-axis sensing element according to embodiments of the present invention.
Figure 3:
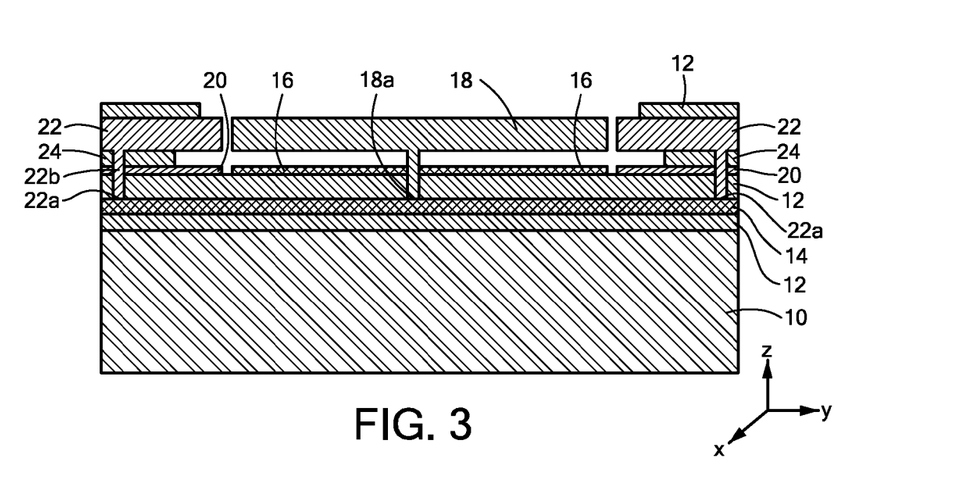
FIG. 3 schematically shows a cross-sectional view of a MEMS device with a movable z-axis sensing element according to embodiments of the present invention.

FIG. 1 shows a process of producing a MEMS sensor with z-axis sensing and FIGS. 2 and 3 schematically show a plan view and a cross-sectional view, respectively, of a MEMS sensor according to illustrative embodiments of the present invention. Referring to FIGS. 1-3, the process of producing a MEMS sensor begins at step 100, which provides a substrate 10. The substrate 10 may be formed from a single crystal silicon wafer, although other materials may be used.

As known by those skilled in the art, one or more layers may be formed on the surface of the substrate 10. For example, the layers may include one or more layers of materials typically used in the manufacture of a MEMS device, such as an oxide layer, a polysilicon layer, a nitride layer, etc., as is well known to those skilled in the art. The various layers may be masked off or patterned using processes well known to those skilled in the art, e.g., using photolithography and etching techniques. For example, as shown in FIG. 3, one or more dielectric layers 12 may be formed on the substrate 10 in order to electrically isolate any conductive layers or the MEMS device from subsequent layers or structures attached to the substrate 10. Accordingly, the substrate 10 may also include one or more conductive layers 14 (e.g., polysilicon, germanium, silicon-germanium) formed on top of or between the dielectric layers 12. The conductive layer 14 may be patterned and may be used to route signals from subsequently formed layers and/or to electrically connect elements, as will be discussed in more detail below.

In step 110, a z-plane MEMS electrode 16 may be formed on the substrate 10, e.g., on the dielectric layers 12 and conductive layer 14. The z-plane MEMS electrode 16 may be patterned and may be formed from a conductive material (e.g., polysilicon, germanium, silicon-germanium). A z-plane reference electrode 20 may also be formed on the substrate 10, substantially coplanar with the z-plane MEMS electrode 16. Similar to the z-plane MEMS electrode 16, the z-plane reference electrode 20 may be patterned and may be formed from a conductive material (e.g., polysilicon, germanium, silicon-germanium). The z-plane reference electrode 20 may be formed during the same deposition process as the z-plane MEMS electrode 16 and made from the same material as the z-plane MEMS electrode 16, although it may be made from different materials.

In step 120, a MEMS structure 18 may be formed above the z-plane MEMS electrode 16. As known by those skilled in the art, the MEMS structure 18 is suspended above the substrate 10 and attached to it, or any layers subsequently formed on the substrate 10. For example, as shown in FIG. 3, the MEMS structure 18 is suspended above the z-plane MEMS electrode 16 and attached to conductive layer 14 at attachment area 18a. Although one attachment area is shown, the MEMS structure 18 may be secured to the substrate 10 in one or more areas, as known by those skilled in the art. For a MEMS inertial sensor, the MEMS structure 18 includes a movable mass with movable structures or fingers and non-moving structures or fingers. The mass and movable structures are movable with respect to the substrate 10, e.g., in the x-, y-, and z-axes. The MEMS structure 18 is formed substantially above the z-plane MEMS electrode 16 so that the z-plane MEMS electrode 16 covers approximately the same area beneath the MEMS structure 18. For example, as shown in FIG. 2, the MEMS structure 18 is square-shaped and the z-plane MEMS electrode 16 (not shown in FIG. 2) is underneath the MEMS structure 18 with approximately the same square shape, although the volumes of the two elements may be different. They also may have other shapes.

In step 130, a reference structure 22 may be formed that is electrically coupled to the mass of the MEMS structure 18. The reference structure 22 may be formed radially outward from the MEMS structure or may be formed radially inward from the MEMS structure, or a portion of the MEMS structure 18. The reference structure 22 may include one or more structures that are formed around the outer edge or toward the inner portion of the MEMS structure 18. For example, the reference structure 22 may be one electrode that circumscribes the MEMS structure 18, as shown in FIG. 2. Alternatively, the reference structure 22 may be composed of several electrodes that together substantially circumscribe the MEMS structure (not shown). Preferably, the area of the reference electrode 22 (whether it is one electrode or several electrodes) is determined by various operational considerations.

For example, the z-plane MEMS electrode 16 potential may be designed so that the electrostatic force that is pulling down the movable mass balances the electrostatic levitation force from the fixed fingers that is pulling up the movable mass. This allows the levitation offset caused by the pulling-up electrostatic force from the fixed fingers to be minimized. Also, in order to balance the charge between two capacitors, the product of the z-plane MEMS electrode 16 potential and the MEMS sensing capacitance should be equal to the product of the z-plane reference electrode 20 potential and the reference capacitance. Thus, in order to get the z-plane MEMS electrode 16 potential to balance the levitation force from the fixed fingers, the area of the reference structure 22 is preferably about one-sixth of the area of the movable mass. In this case, the z-plane MEMS electrode 16 potential should be about one-sixth of that of the z-plane reference electrode 20 potential. This allows the z-plane MEMS electrode 16 potential to minimize the levitation offset.

The reference structure 22 is partially suspended above the z-plane reference electrode 20, as shown in FIG. 3. Preferably, both the MEMS structure 18 and the reference structure 22 are suspended above the z-plane MEMS electrode 16 and the z-plane reference electrode 20, respectively, by an approximately equal distance. The gap between these layers may be caused by the removal of the same sacrificial dielectric layer (the remaining portion shown as layer 24 in FIG. 3) under both structures 18, 22 during a release step as well known to those skilled in the art. Thus, in some embodiments, one surface of the reference structure 22 is substantially coplanar with one surface of the MEMS structure 18, preferably the surface of the reference structure 22 and the MEMS structure 18 facing the z-plane reference electrode 20 and the z-plane MEMS electrode 16, respectively. The gap between the MEMS structure 18 and the z-plane MEMS electrode 16 and the gap between the reference structure 22 and z-plane reference electrode 20 may also be different.

The reference structure 22 may be formed during the same deposition process as the MEMS structure 18 and made from the same material as the MEMS structure 18, although it may be made from different materials. The reference structure 22 may be used when measuring the z-axis movement of the movable mass (e.g., up and down movement as shown in FIG. 3) to increase the accuracy of the measurement, as will be described in further detail below. The reference structure 22 may also be used when measuring the x-axis movement of the movable mass (e.g., in and out of the page as shown in FIG. 3) and the y-axis movement (e.g., right and left as shown in FIG. 3).

The reference structure 22 may be electrically coupled to the movable mass of the MEMS structure 18 to form a single sensing element, referred to herein as (18, 22). For example, the reference structure 22 may be coupled to the same conductive layer as the movable mass of the MEMS structure 18, e.g., conductive layer 14. Although the reference structure 22 is shown coupled to the conductive layer 14 in two areas, areas 22a in FIG. 3, the reference structure 22 may be coupled to the conductive layer 14 (or any other conductive layer) in one or more areas. The connecting portion 22b of the reference structure 22, which spans the distance between the reference structure 22 and the conductive layer 14, may be electrically isolated from the z-plane reference electrode 20 so that the reference structure 22 does not couple or short to the z-plane reference electrode 20. For example, this may be accomplished by surrounding the connecting portion 22b with a dielectric material where the connecting portion 22b passes through the z-plane reference electrode 20 as known by those skilled in the art. In a similar manner, the movable mass of the MEMS structure 18 may be electrically isolated from the z-plane MEMS electrode 16.

In some embodiments, a dielectric layer 12 may be formed on the reference structure 22 to electrically isolate the MEMS sensor from subsequent layers or structures attached to the substrate 10. In some embodiments, a cap may be formed above the MEMS structure 18 and attached or bonded to the substrate 10 in order to cover or protect the MEMS structure 18. The cap may encapsulate the MEMS structure 18 protecting it from hazards such as particles, gases, etc., that might impact the functioning of the MEMS sensor.

Figure 4:
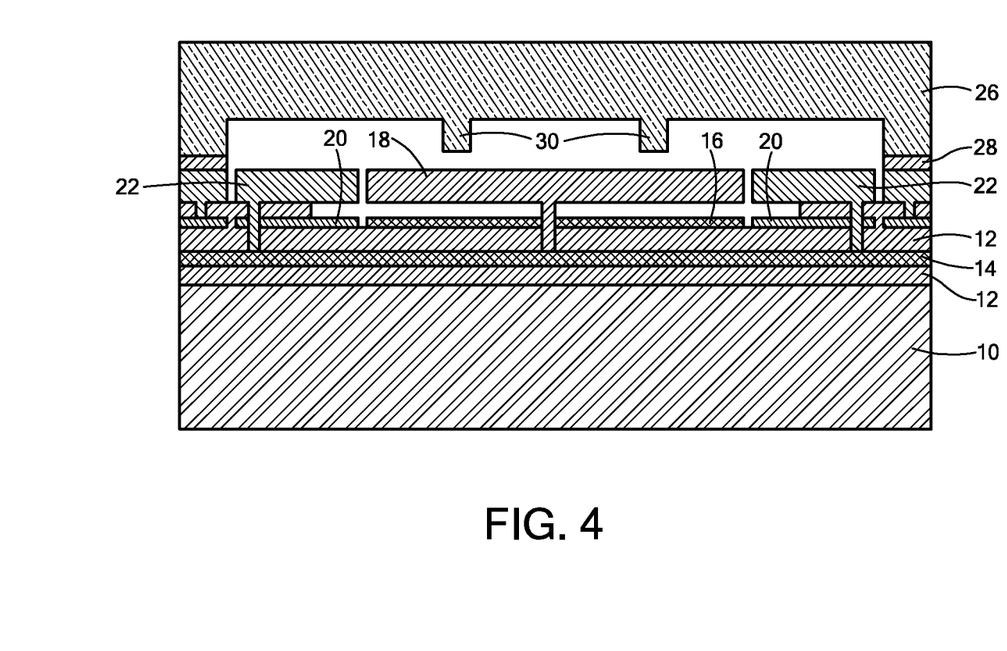
FIG. 4 schematically shows a cross-sectional view of a MEMS device with a movable z-axis sensing element and a cap according to embodiments of the present invention.

For example, FIG. 4 schematically shows a cross-sectional view of a MEMS sensor with a movable z-axis sensing element covered with a cap 26 according to some embodiments of the present invention. The cap 26 may be positioned on the substrate 10 such that the portion of the cap 26 that contacts the substrate 10 circumscribes one or more MEMS structures 18 formed on the substrate 10. The cap 26 may also be positioned to surround circuitry formed on or in the substrate 10 and coupled to the MEMS structure 18. The substrate 10 may include one or more layers 28 formed around the MEMS structure(s) 18 for attaching the cap 26 to the substrate 10. These layers 28 may be formed from conductive or nonconductive materials which may allow the cap 26 to be electrically connected or isolated from the substrate 10. The cap 26 may be formed from a wafer and may include one or more layers formed on the wafer. In some embodiments, the cap 26 may be attached to the substrate 10 to form an hermetic seal. In some embodiments, the cap 26 may include a hole or opening (not shown) through which the ambient may enter into the MEMS sensor, allowing the MEMS structure 18 to be exposed to the surrounding atmosphere. As shown, the cap 26 may include one or more cap stoppers 30 to prevent the movable mass from moving too far in the z-direction and contacting other components or parts during a shock event.

During operation, a potential is applied to an electrode positioned above or below the MEMS structure 18 and the reference structure 22. For example, a potential may be applied to the z-plane MEMS electrode 16 located substantially beneath the MEMS structure 18. In this case, the z-plane MEMS electrode 16 forms one part of the capacitor and the movable mass of the MEMS structure 18 and the reference structure 22, together as a single sensing element, form the other part of the capacitor. When the mass moves, a change in capacitance may be measured relative to the fixed z-plane MEMS electrode 16. In this manner, the sensing element (18, 22) is used to measure the change in capacitance between one element (the z-plane MEMS electrode 16) and the other element (the MEMS structure 18 and the reference structure 22 (primarily the movable mass of the MEMS structure 18 due to its proximity)). Thus, the sensing element (18, 22) senses the movement of the MEMS structure's movable, inertial mass in the z-axis (e.g., toward or away from the z-plane MEMS electrode 16 as shown in FIG. 3). Although the z-plane MEMS electrode 16 is shown below the MEMS structure 18, in some embodiments the electrode may be positioned above the MEMS structure 18 and the reference structure 22.

Another potential may then be applied to another electrode positioned above or below the MEMS structure 18 and the reference structure 22, e.g., at a designated time different than the z-plane MEMS electrode 16 potential. For example, the potential may be applied to the z-plane reference electrode 20 positioned substantially beneath the reference structure 22. In order to balance the charge between two capacitors, the product of the z-plane MEMS electrode 16 potential and the MEMS sensing capacitance needs to be equal to the product of the z-plane reference electrode 20 potential and the reference capacitance. For example, when the area of the reference structure 22 is about one-sixth of the area of the movable mass, then the z-plane reference electrode 20 potential should be about six times that of the z-plane MEMS electrode 16 potential. In this case, the z-plane reference electrode 20 forms one part of the capacitor and the MEMS structure 18 and the reference structure 22 together form the other part of the capacitor. As before, the sensing element (18, 22) is used to measure the change in capacitance between the z-plane reference electrode 20 and the sensing element (18, 22) (primarily the reference structure 22 due to its proximity). In this way, the fixed reference structure 22, in conjunction with the z-plane reference electrode 20, may be used to provide a reference to offset any environmental and process parameter changes that may affect the MEMS sensor in order to increase the accuracy of its measurement. For example, if operating conditions (e.g., temperature, pressure, humidity) cause the movable mass of the MEMS structure 18 to change in any way (e.g., expand, contract), then that portion of the reference structure 22 that is suspended above the z-plane reference electrode 20 should experience a similar type of change. Thus, any change in capacitance due to environmental conditions between the z-plane reference electrode 20 and the reference structure 22 may be used as an offset for the capacitance measurement made between the z-plane MEMS electrode 16 and sensing element (18, 22) to reduce any environmental variations.

With this configuration, manufacturing variations effecting the offset and sensitivity of the MEMS sensor may be reduced since the gap between the z-plane MEMS electrode 16 and the MEMS structure 18 and the gap between the z-plane reference electrode 20 and the reference structure 22 are both preferably determined by the same sacrificial oxide thickness with a well-controlled space or gap. In addition, using the MEMS structure 18 and the reference structure 22 as the z-axis sensing element, instead of an electrode under the MEMS structure 18, may minimize the noise induced by parasitic capacitance between an electrode under the MEMS structure and the substrate.

In some embodiments, there may be two sensing phases or modes, one for the x- and y-axes and one for the z-axis. As described above, the z-phase may use the sensing element (18, 22), which includes the movable, inertial mass. In the xy-phase, the inertial mass may be used as the sensing element. This configuration allows all three axes of sensing to effectively be accomplished with one inertial mass.

Figure 5:
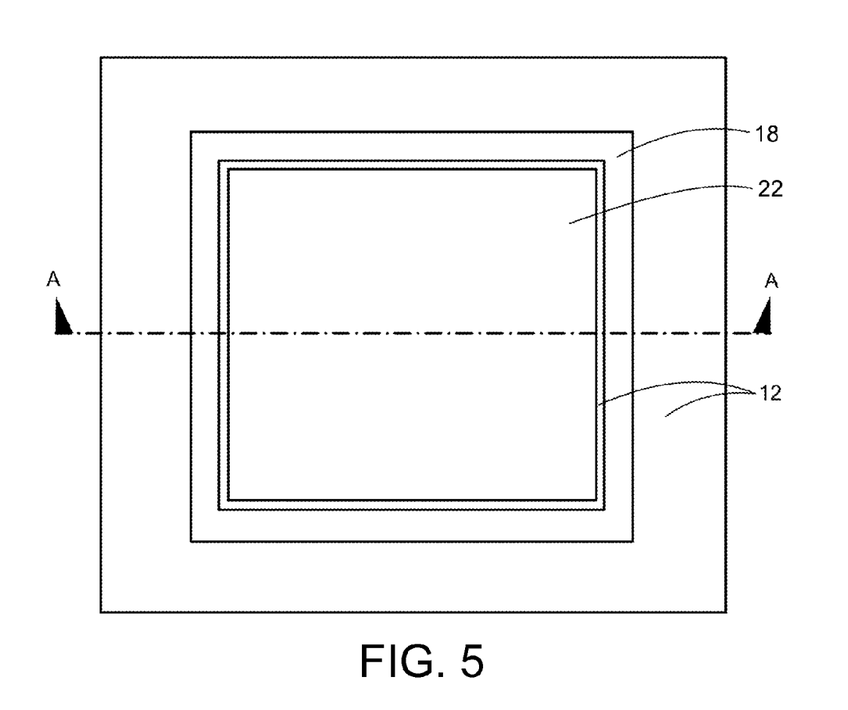
FIG. 5 schematically shows a plan view of another MEMS device with a movable z-axis sensing element according to embodiments of the present invention.
Figure 6:
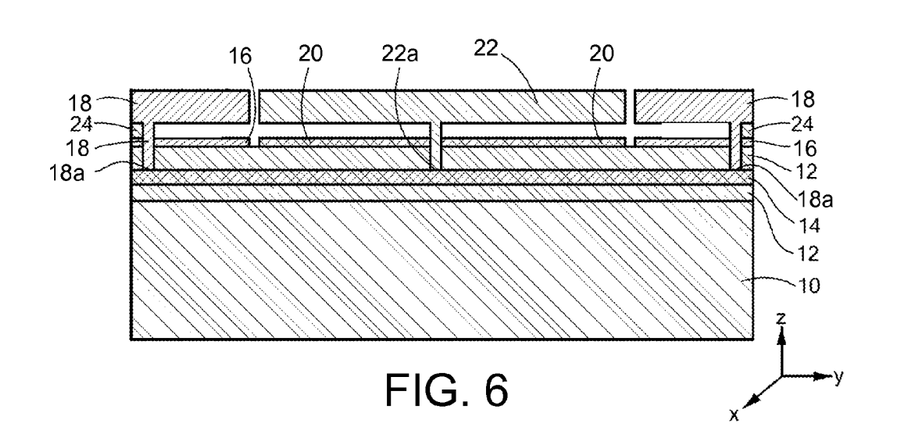
FIG. 6 schematically shows a cross-sectional view of FIG. 5 with a movable z-axis sensing element according to embodiments of the present invention.

Although the substrate 10 has been shown and described in FIGS. 2-3 having a certain configuration, other layers and structures may be formed in and/or on the substrate. For example, the substrate 10 may have additional layers formed on the substrate underneath, coplanar with, or above the MEMS structure. In addition, although the reference structure is shown on the outside of the MEMS structure in FIGS. 2 and 3, the MEMS structure 18, or a portion thereof, may be formed around the reference structure 22, as shown in FIGS. 5 and 6, radially outward from the reference structure 22.

To complete the process of producing the MEMS sensor discussed in FIG. 1, other processing steps may be used. For example, if done in a batch process, the wafer(s) may be diced to form a plurality of individual dies. As used herein, the terms "wafer" and "die" may be used interchangeably, although a wafer may form a plurality of individual dies. Some embodiments may implement post-processing methods for integrating the MEMS sensor with circuitry on the same die or another die. In addition, other processing steps may be performed on the MEMS sensor to integrate it with packages or other components and/or devices.

Although the above discussion discloses various exemplary embodiments of the invention, it should be apparent that those skilled in the art can make various modifications that will achieve some of the advantages of the invention without departing from the true scope of the invention.

What is claimed is:

1. A MEMS sensor comprising:
   a substrate;
   a MEMS structure coupled to the substrate and having a mass movable with respect to the substrate; and
   a reference structure electrically coupled to the movable mass of the MEMS structure, wherein the MEMS structure is radially outward from the reference structure.

2. The MEMS sensor of claim 1, wherein the MEMS structure substantially circumscribes the reference structure.

3. The MEMS sensor of claim 1, wherein one surface of the reference structure is substantially coplanar with one surface of the MEMS structure.

4. The MEMS sensor of claim 1, further comprising a z-plane MEMS electrode formed on the substrate, wherein the MEMS structure is formed substantially above the z-plane MEMS electrode.

5. The MEMS sensor of claim 4, further comprising a z-plane reference electrode formed on the substrate and coplanar with the z-plane MEMS electrode, the z-plane reference electrode formed substantially beneath the reference structure.

6. The MEMS sensor of claim 1, further comprising a cap formed above the MEMS structure and the reference structure, the cap encapsulating the MEMS structure and the reference structure.

7. The MEMS sensor of claim 1, wherein the substrate further includes electronic circuitry formed on or in the substrate.

8. A method of producing a MEMS sensor, the method comprising:
   providing a substrate;
   forming a MEMS structure coupled to the substrate and having a mass movable with respect to the substrate; and
   forming a reference structure electrically coupled to the movable mass of the MEMS structure, wherein the MEMS structure is radially outward from the reference structure.

9. The method of claim 8, wherein the MEMS structure substantially circumscribes the reference structure.

10. The method of claim 8, wherein one surface of the reference structure is substantially coplanar with one surface of the MEMS structure.

11. The method of claim 8, further comprising:
    forming a z-plane MEMS electrode on the substrate, wherein the MEMS structure is formed substantially above the z-plane MEMS electrode.

12. The method of claim 11, further comprising:
    forming a z-plane reference electrode on the substrate substantially coplanar with the z-plane MEMS electrode, the z-plane reference electrode formed substantially beneath the reference structure.

13. The method of claim 12, wherein forming the z-plane MEMS electrode and forming the z-plane reference electrode are performed during the same processing step.

14. The method of claim 8, wherein forming the reference structure and forming the MEMS structure are performed during the same processing step.

15. The method of claim 8, further comprising:
    forming a cap above the MEMS structure and the reference structure, the cap encapsulating the MEMS structure and the reference structure.

16. A method of measuring motion in a z-axis using a MEMS sensor, the method comprising:
    providing a substrate having a z-plane MEMS electrode on the substrate;
    providing a MEMS structure substantially above the z-plane MEMS electrode, the MEMS structure coupled to the substrate and having a mass movable with respect to the substrate;
    providing a reference structure electrically coupled to the movable mass to form a sensing element;

applying a potential to the z-plane MEMS electrode; and
measuring a change in capacitance between the sensing element and the z-plane MEMS electrode using the sensing element, wherein the MEMS structure is radially outward from the reference structure.

17. The method of claim 16, wherein the MEMS structure substantially circumscribes the reference structure.

18. The method of claim 16, further comprising:
providing a z-plane reference electrode on the substrate substantially coplanar with the z-plane MEMS electrode, the z-plane reference electrode formed substantially beneath the reference structure;
applying a potential to the z-plane reference electrode; and
measuring a change in capacitance between the sensing element and the z-plane reference electrode using the sensing element.

\* \* \* \* \*